(12) United States Patent
Miyakawa et al.

(10) Patent No.: US 8,248,835 B2
(45) Date of Patent: Aug. 21, 2012

(54) SEMICONDUCTOR MEMORY AND TEST METHOD FOR THE SEMICONDUCTOR MEMORY

(75) Inventors: Tadashi Miyakawa, Kanagawa-ken (JP); Daisaburo Takashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 349 days.

(21) Appl. No.: 12/718,800

(22) Filed: Mar. 5, 2010

(65) Prior Publication Data

US 2010/0238699 A1    Sep. 23, 2010

(30) Foreign Application Priority Data

Mar. 17, 2009   (JP) ................ P2009-064224

(51) Int. Cl.
*G11C 11/12* (2006.01)

(52) U.S. Cl. ......... 365/145; 365/201; 365/203; 365/205

(58) Field of Classification Search .................. 365/145, 365/201, 203, 205
See application file for complete search history.

(56) References Cited

U.S. PATENT DOCUMENTS

| 6,993,691 | B2 | 1/2006 | Ogiwara et al. |
| 7,486,578 | B2 | 2/2009 | Miyakawa et al. |
| 2002/0031004 | A1* | 3/2002 | Miyamoto ..................... 365/145 |
| 2003/0142565 | A1* | 7/2003 | McClure ....................... 365/201 |

FOREIGN PATENT DOCUMENTS

JP   2002-313100   10/2002

* cited by examiner

*Primary Examiner* — Hoai V Ho
(74) *Attorney, Agent, or Firm* — Knobbe, Martens, Olson & Bear, LLP (57) ABSTRACT

Semiconductor memory contains memory cells having ferroelectric capacitors and cell transistors, bit lines connected to memory cells, word lines connected to gate electrodes of cell transistors, plate lines connected to one of two electrodes of ferroelectric capacitors, sense amplifiers connected between each pair of bit lines. Further, a test pad is provided in order to apply an external voltage to each of bit lines, test transistors are provided corresponding to bit lines respectively, each of test transistors is connected between the test pad and each of bit lines, a fatigue test bias circuit is connected to a first node located between the test pad and test transistors. Test transistors are shared in a first test to apply a first voltage to ferroelectric capacitors from an outside via the test pad and a second test to apply a second voltage to ferroelectric capacitors from the fatigue test bias circuit.

20 Claims, 5 Drawing Sheets

SECOND EMBODIMENT

SEMICONDUCTOR MEMORY AND TEST METHOD FOR THE SEMICONDUCTOR MEMORY

CROSS REFERENCE TO RELATED APPLICATION

This application is based upon and claims the benefit of priority from the prior Japanese Patent Application No. 2009-064224, filed on Mar. 17, 2009, the entire contents of which are incorporated herein by reference.

FIELD OF THE INVENTION

The invention relates to a semiconductor memory and a test method for the semiconductor memory.

DESCRIPTION OF THE BACKGROUND

A ferroelectric memory stores data by use of polarization of a ferroelectric capacitor having hysteresis characteristics. A polarization direction is determined by controlling a direction of an electric field to be applied to the ferroelectric capacitor. For example, in order to write data "1" into the ferroelectric capacitor, electric potential on a bit line connected to one of electrodes of the ferroelectric capacitor is increased to a high level and electric potential on a plate line connected to the other electrode of the ferroelectric capacitor is decreased to a low level. On the other hand, in order to write data "0" into the ferroelectric capacitor, the electric potential on the bit line is decreased to a low level and the electric potential on the plate line is increased to a high level. The ferroelectric polarization direction is determined in this manner and thus either data "0" or data "1" is written into a memory cell.

In a reading operation, the electric potential on the bit line is decreased to the low level while the electric potential on the plate line is increased to the high level. Accordingly, charges corresponding to the ferroelectric polarization direction are transmitted to the bit line. A sense amplifier amplifies the electric potential on the bit line to read data. Since the ferroelectric memory is a destructive read-out type memory, the sense amplifier writes the read data back into the memory cell.

For an evaluation test of polarization characteristics of such a ferroelectric memory, a voltage is applied directly from outside to the bit line, and then an amount of signals (a difference in amount between signals "0" and "1") in each memory cell is measured. In addition, to conduct a fatigue test for the ferroelectric memory, high-level and low-level voltages are alternately applied to the electrodes on both ends of the ferroelectric capacitor in a repeated manner. That is, the high-level and low-level voltages are alternately applied to the bit line and the plate line in a repeated manner. A test method for a semiconductor memory including these tests has been disclosed in Japanese Patent Application Publication No. 2002-313100.

According to the disclosed test method for a semiconductor memory, each bit line needs a transistor to connect the bit line with an external pad for the evaluation test of the polarization characteristics. Moreover, each bit line (or each pair of bit lines) also needs a circuit to apply a high-level or low-level voltage to the bit line for the fatigue test.

The evaluation test of the polarization characteristics of the ferroelectric capacitor and the fatigue test for the ferroelectric capacitor are necessary to ensure reliability of the ferroelectric memory. However, for the disclosed test method for a semiconductor memory, elements which are necessary for the evaluation test and the fatigue test need to be mounted in the memory. Such requirement has been one of obstacles to reducing a chip size of such a ferroelectric memory.

SUMMARY OF THE INVENTION

A semiconductor memory according to an embodiment of the invention includes: a plurality of memory cells arranged two dimensionally in a matrix form, each of the plurality of memory cells containing a ferroelectric capacitor having a ferroelectric film sandwiched between two electrodes and a cell transistor provided corresponding to the ferroelectric capacitor; a plurality of bit lines respectively connected to the plurality of memory cells; a plurality of word lines respectively connected to gate electrodes of the plurality of cell transistors; a plurality of plate lines respectively connected to one of two electrodes of the plurality of ferroelectric capacitors; a plurality of sense amplifiers respectively connected between a pair of the plurality of bit lines; at least one test pad provided in order to apply an external voltage to each of the plurality of bit lines; a plurality of test transistors provided corresponding to the plurality of bit lines respectively, each of the plurality of test transistors connected between the test pad and each of the plurality of bit lines; and a fatigue test bias circuit connected to a first node located between the test pad and the plurality of test transistors, wherein the plurality of test transistors are shared in a first test to apply a first voltage to the plurality of ferroelectric capacitors from an outside via the test pad and a second test to apply a second voltage to the plurality of ferroelectric capacitors from the fatigue test bias circuit.

A test method of a semiconductor memory according to an embodiment of the invention, the semiconductor memory including a plurality of memory cells arranged two dimensionally in a matrix form, each of the plurality of memory cells containing a ferroelectric capacitor having a ferroelectric film sandwiched between two electrodes and a cell transistor provided corresponding to the ferroelectric capacitor, a plurality of bit lines respectively connected to the plurality of memory cells, a plurality of word lines respectively connected to gate electrodes of the plurality of cell transistors, a plurality of plate lines respectively connected to one of two electrodes of the plurality of ferroelectric capacitors, a plurality of sense amplifiers respectively connected between a pair of the plurality of bit lines, at least one test pad provided in order to apply an external voltage to each of the plurality of bit lines, a plurality of test transistors provided corresponding to the plurality of bit lines respectively, each of the plurality of test transistors connected between the test pad and each of the plurality of bit lines and a fatigue test bias circuit connected to a first node located between the test pad and the plurality of test transistors, the test method including selecting a first test to apply a first voltage to the plurality of ferroelectric capacitors from an outside via the test pad or a second test to apply a second voltage to the plurality of ferroelectric capacitors from the fatigue test bias circuit in response to an enable signal; applying the voltage of the selected test to the plurality of ferroelectric capacitors via the test transistor; and evaluating polarization characteristics of the plurality of ferroelectric capacitors after applying the voltage of the selected test.

DETAILED DESCRIPTION OF THE INVENTION

Embodiments of the invention will be described below with reference the drawings. It is to be noted that the embodiments will not limit the invention.

First Embodiment

Figure 1:
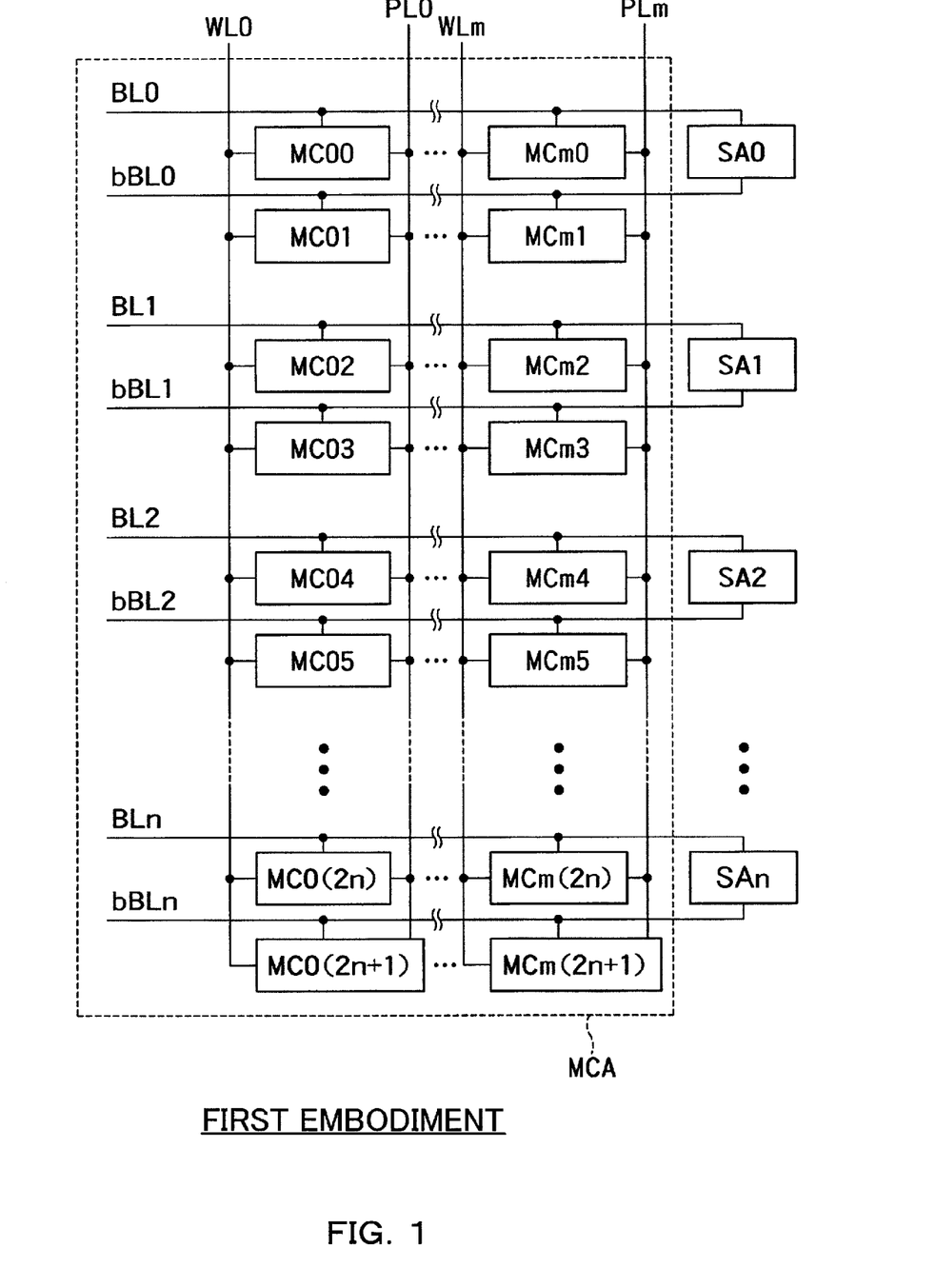
FIG. 1 is a block diagram showing a configuration of a semiconductor memory device according to a first embodiment of the invention.

FIG. 1 is a block diagram showing a configuration of a memory device according to a first embodiment of the invention. The memory device of the invention may be any memory configured to store a digital value as information data in a memory cell and to cause a sense amplifier to detect the information data based on reference data. For example, the memory device may be a DRAM, a ferroelectric memory, a memory, and the like. The embodiment exemplified below is the one of a ferroelectric memory. For example, the ferroelectric memory of the embodiment may have a cell configuration similar to a configuration of a DRAM cell. Specifically, in the cell of the ferroelectric memory, a ferroelectric capacitor is connected to a cell transistor in series to form a memory cell, one end of the cell transistor is connected to a bit line, and one end of the ferroelectric capacitor is connected to a plate line. Alternatively, the ferroelectric memory of the embodiment may be a so-called "Series connected TC unit type ferroelectric RAM" in which multiple unit cells are connected to each other in series, each of the unit cells formed in a way that two ends of a capacitor (C) are connected respectively to a source and a drain of a cell transistor (T). Here, the memory cell in which the cell transistor is connected to the ferroelectric capacitor in series is exemplified.

The memory device includes a memory cell array MCA, bit lines BL0 to BLn, bBL0 to bBLn (hereinafter also referred to as BL simply), word lines WL0 to WLm (hereinafter also referred to as WL simply), and sense amplifiers SA0 to SAn (hereinafter also referred to as SA simply). Note that n and m are integers, respectively.

The memory cell array MCA includes multiple memory cells MCij (i, j are integers, respectively) which are two-dimensionally arranged in a matrix form. Each of the memory cells MCij includes a ferroelectric capacitor having two electrodes and a ferroelectric film located between the two electrodes and a cell transistor provided so as to correspond to the ferroelectric capacitor.

The multiple bit lines BL extend in a column direction. Each of the bit lines BL is connected to the cell transistors of the multiple memory cells MC disposed in the column direction. Each bit line BL is connected to one of the electrodes of each ferroelectric capacitor via the corresponding cell transistor.

The multiple word lines WL extend in a row direction which is orthogonal to the column direction. Each of the word lines WL is connected to gates of the cell transistors of the multiple memory cells MC disposed in the row direction.

Multiple plate lines PL extend in the row direction. Each of the plate lines PL is connected to the other one of the electrodes of each of the ferroelectric capacitors of the multiple memory cells MC disposed in the row direction.

The sense amplifier SAi is provided for each pair of bit lines BLi, bBLi (i is an integer). The sense amplifier SAi is connected between the paired bit lines BLi, bBLi. For example, the sense amplifier SAi detects information data transmitted to the bit line BLi, based on reference data transmitted to the bit line bBLi. On the other hand, the sense amplifier SAi can also detect information data transmitted to the bit line bBLi, based on reference data transmitted to the bit line BLi. The sense amplifier SAi latches the detected information data.

The sense amplifier SAi outputs the detected information to the outside via a DQ buffer and an I/O circuit (both not shown). Alternatively, the sense amplifier SAi plays a role to receive information data from the outside via the DQ buffer and the I/O circuit (both not shown) and to write the data in the memory cell MC.

Figure 2:
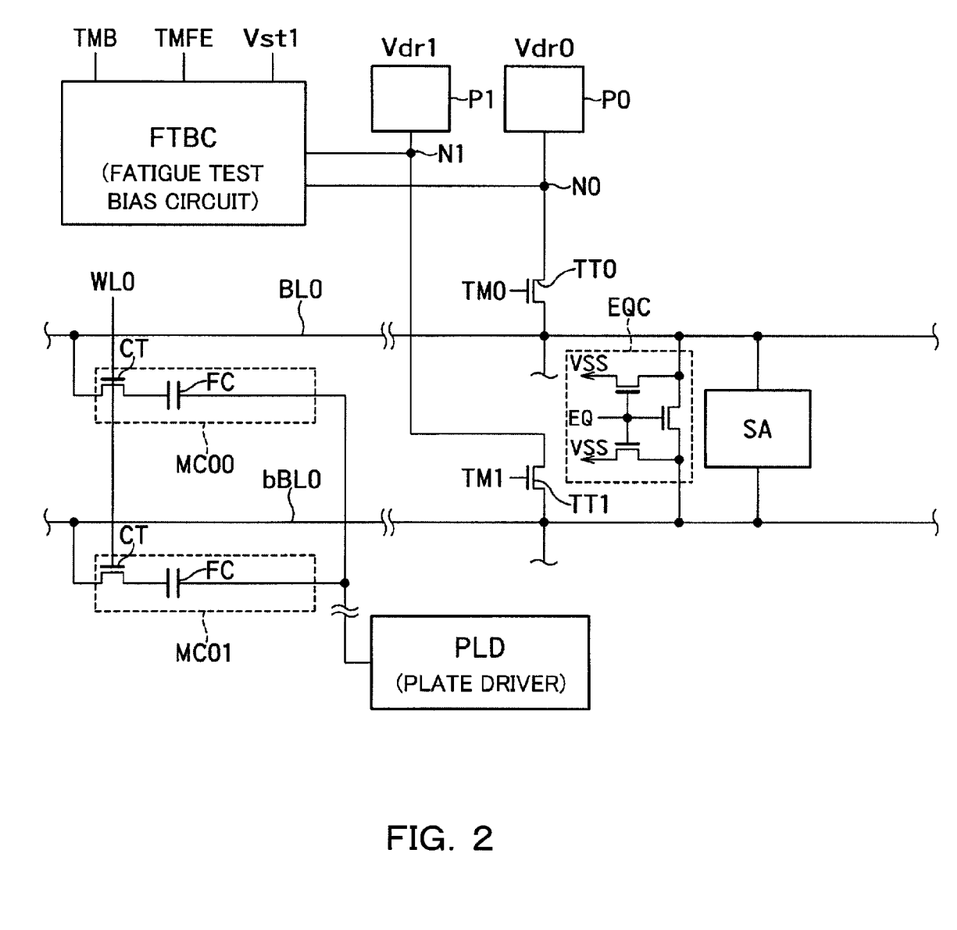
FIG. 2 is a circuit diagram showing a fatigue test bias circuit FTBC, test pads P0, P1 for an evaluation test, and peripheral portions of the fatigue test bias circuit FTBC and the test pads P0, P1.

FIG. 2 is a circuit diagram showing a fatigue test bias circuit FTBC, test pads P0, P1 for an evaluation test, and peripheral portions of the fatigue test bias circuit FTBC and the test pads P0, P1 (a first and a second test pads). The test pads P0, P1 are used for the evaluation test to evaluate polarization characteristics of a ferroelectric capacitor FC. The test pad P0 is provided to be shared among the bit lines BL0 to BLn. The test pad P1 is provided to be shared among the bit lines bBL0 to bBLn. The test pads P0, P1 are provided in order to directly apply external voltages to the bit lines BL0 to BLn and the bit lines bBL0 to bBLn, before a wafer is diced.

Test transistors TT0, TT1, ..., TT2n+1 are provided so as to correspond to the multiple bit lines BL0 to BLn, bBL0 to bBLn, respectively. Specifically, the test transistors TT0, TT2, TT4, ..., TT2n correspond to the bit lines BL0 to BLn while the test transistors TT1, TT3, TT5, ..., TT2n+1 correspond to the bit lines bBL0 to bBLn. The test pad P0 is connected to the bit lines BL0 to BLn via the test transistors TT0, TT2, TT4, ..., TT2n. The test pad P1 is connected to the bit lines bBL0 to bBLn via the test transistors TT1, TT3, TT5, ..., TT2n+1.

The test transistors TT0, TT1, ..., TT2n+1 are conducted at the time when the ferroelectric capacitor FC is subjected to the evaluation test of the polarization characteristics and a fatigue test.

Further, the fatigue test bias circuit FTBC is connected to a node N0 located between the test pad P0 and the test transistors TT0, TT2, TT4, ..., TT2n and to a node N1 located between the test pad P1 and the test transistors TT1, TT3, TT5, ..., TT2n+1. The fatigue test bias circuit FTBC is shared by the bit lines BL0 to BLn, bBL0 to bBLn.

The evaluation test (a first test) of the polarization characteristics of the ferroelectric capacitor FC is a test in which voltages Vdr0, Vdr1 (a first voltage) applied from the outside are gradually changed to find the voltages Vdr0, Vdr1 at a time point when the ferroelectric polarization direction is changed. The evaluation test reveals a level of the polarization characteristics of the ferroelectric capacitor FC and a degree of deterioration of the ferroelectric capacitor FC. To find out the polarization characteristics of the ferroelectric capacitor FC, the voltages Vdr0, Vdr1 to be inputted from the test pads P0, P1 must be variable. Accordingly, the voltages in the evaluation test are applied from the outside via the test pads P0, P1. Here, the evaluation test of the polarization characteristics is usually conducted at a wafer stage before dicing.

In the fatigue test of the ferroelectric capacitors FC (a second test), the fatigue test bias circuit FTBC applies high level electric potential and low level electric potential (a second voltage) alternately to two electrodes of the ferroelectric capacitors FC in a repeated manner. Here, the test pads P0, P1 are electrically disconnected from the outside. Accordingly, the ferroelectric capacitor FC repeats polarization inversion and degrades in the polarization characteristics. The degree of deterioration (degree of fatigue) of the ferroelectric capacitor FC can be found by conducting the evaluation test of the polarization characteristics before and after conducting a predetermined number of times of the fatigue tests. The fatigue test is conducted by sampling several chips after the chips are assembles.

In the fatigue test, a constant voltage Vst1 is applied to the ferroelectric capacitor FC. A reference symbol TMB denotes a test bit line signal indicating timing to start up the bit lines BL in a test mode. Meanwhile, a reference symbol TMFE denotes an enable signal indicating entry in a fatigue test mode.

Conventionally, the test pads P0, P1 and the fatigue test bias circuit FTBC are individually connected to the bit lines BL, bBL. Specifically, a test transistor is provided individually to the fatigue test bias circuit FTBC and the test pads P0, P1. Here, the number of the test transistors is multiplied. Since the test transistors are provided so as to correspond to the bit lines BL, the chip size is considerably increased if the number of the test transistors is multiplied.

In contrast, in the embodiment, the line extending from the node N0 to the bit line BL0, the line extending from the node N1 to the bit line bBL0, and the test transistors TT0 to TT2$n$+1 are shared in the evaluation test of polarization characteristics and the fatigue test. Accordingly, only one of the test transistors TT0 to TT2$n$+1 has to be provided to each bit line BL. Moreover, layouts of the lines from the fatigue test bias circuit FTBC to the bit lines BL and the lines from the test pads P0, P1 to the bit lines BL are made simpler than layouts in the related art.

An equalizing circuit EQC is provided in order that the bit lines BL0, bBL0 equally have a low level electric potential (such as source electric potential VSS) at the time of standby.

A PL driver PLD is a driver to drive the plate lines PL. The PL driver PLD drives the plate lines PL in a way that the electric potential on the plate lines PL almost logically opposite to the electric potential of the signal TMB in the fatigue test. Hence the bit lines BL and the plate lines PL are alternately switched to the high level. Accordingly, the data pieces "0" and "1" are repeatedly written into the ferroelectric capacitor FC.

Figure 3A:
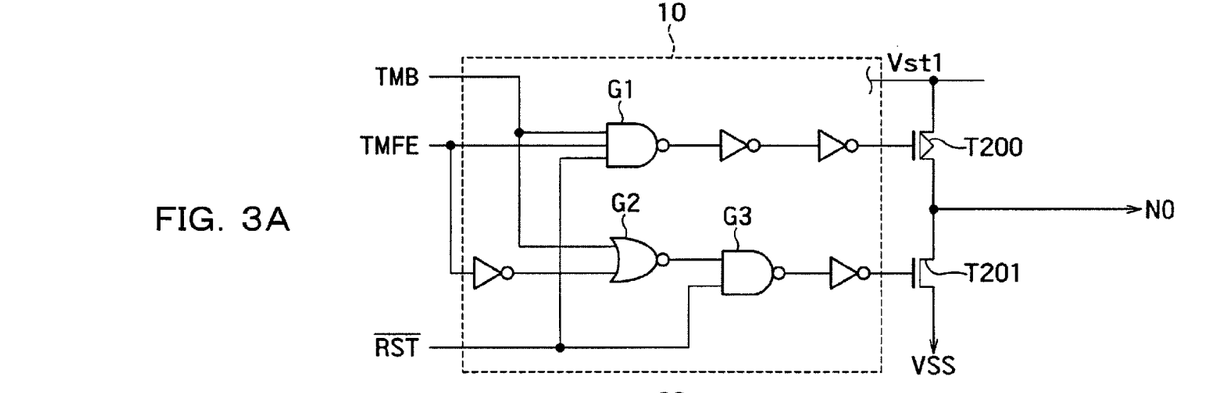
FIGS. 3A and 3B are circuit diagrams each showing internal configuration of the fatigue test bias circuit FTBC.
Figure 3B:
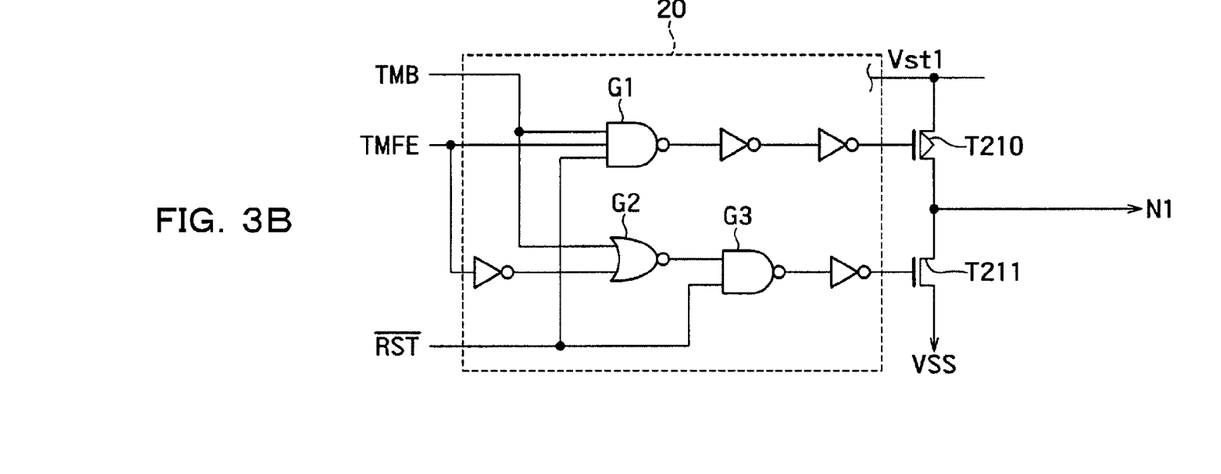

FIG. 3A and FIG. 3B are circuit diagrams each showing internal configuration of the fatigue test bias circuit FTBC. The fatigue test bias circuit FTBC includes a transistor T200 connected between the node N0 and a first voltage source Vst1 and a transistor T201 connected between the node N0 and a second voltage source VSS. Alternatively, the fatigue test bias circuit FTBC includes a transistor T210 connected between the node N1 and the first voltage source Vst1 and a transistor T211 connected between the node N1 and the second voltage source VSS.

The transistors T200, T210 are P-channel MOS transistors. The transistors T201, T211 are N-channel MOS transistors.

As shown in FIG. 3A, gates of the transistors T200, T201 are connected to a logic circuit 10. The logic circuit 10 receives the signals TMB, TMFE, and a reset signal RST (bar) and controls the transistors T200, T201. The reset signal RST (bar) is an inverted signal of the reset signal RST. The reset signal RST (bar) is the signal which is in the low level (a non-active state) at the time of starting the memory or when forcibly reset from the outside and is in the high level (an active state) at the time of normal operation of the memory. When the reset signal RST (bar) is in the low level, the logic circuit 10 makes the transistors T200, T201 non-conductive. Hence the electric potential of the node N0 is in a floating state.

Meanwhile, the signal TMFE is inactivated to be in the low level during the evaluation test of the polarization characteristics and the normal operation (read/write). Hence the logic circuit 10 makes the transistors T200, T201 non-conductive also during the evaluation test and the normal operation. At this time, the electric potential of the node N0 is in the floating state. In the fatigue test, the logic circuits 10 makes one of the transistors T200, T201 conductive, and the other one non-conductive. When the transistor T200 is made conductive, the electric potential of the node N0 becomes the high level electric potential Vst1. When the transistor T201 is made conductive, the electric potential of the node N0 becomes the low level electric potential VSS. Therefore, the electric potential of the node N0 can be changed in three levels, i.e., in the floating state, the high level electric potential Vst1, and the low level electric potential VSS.

The circuit shown in FIG. 3B is similar to the circuit shown in FIG. 3A. Accordingly, explanation on the operation of the circuit will be omitted. Here, when the transistors T210, T211 are non-conductive, the electric potential of the node N1 is in the floating state. When the transistor T210 is made conductive, the electric potential of the node N1 becomes the high level electric potential Vst1. When the transistor T211 is made conductive, the electric potential of the node N1 becomes the low level electric potential VSS. Therefore, the electric potential of the node N1 can be changed in three levels, i.e., in the floating state, the high level electric potential Vst1, and the low level electric potential VSS.

Since the logic circuits 10, 20 have the same configuration, only one of the configurations will be described further in detail. A NAND gate G1 performs a NAND operation on the signals TMB, TMFE, RST (bar). An output from the NAND gate G1 is supplied to the gate of the transistor T200 via an even number of inverters.

A NOR gate G2 performs a NOR operation on the signal TMB and the inverted signal of the signal TMFE. An output from the NOR gate G2 is inputted to a NAND gate G3. The NAND gate G3 performs a NAND operation on the output from the NOR gate G2 and the signal RST (bar). An output from the NAND gate G3 is inverted and then inputted to the transistor T201.

The logic circuits 10, 20 are merely examples and the logic circuit according to the invention will not be limited only to the configuration described herein.

Figure 4:
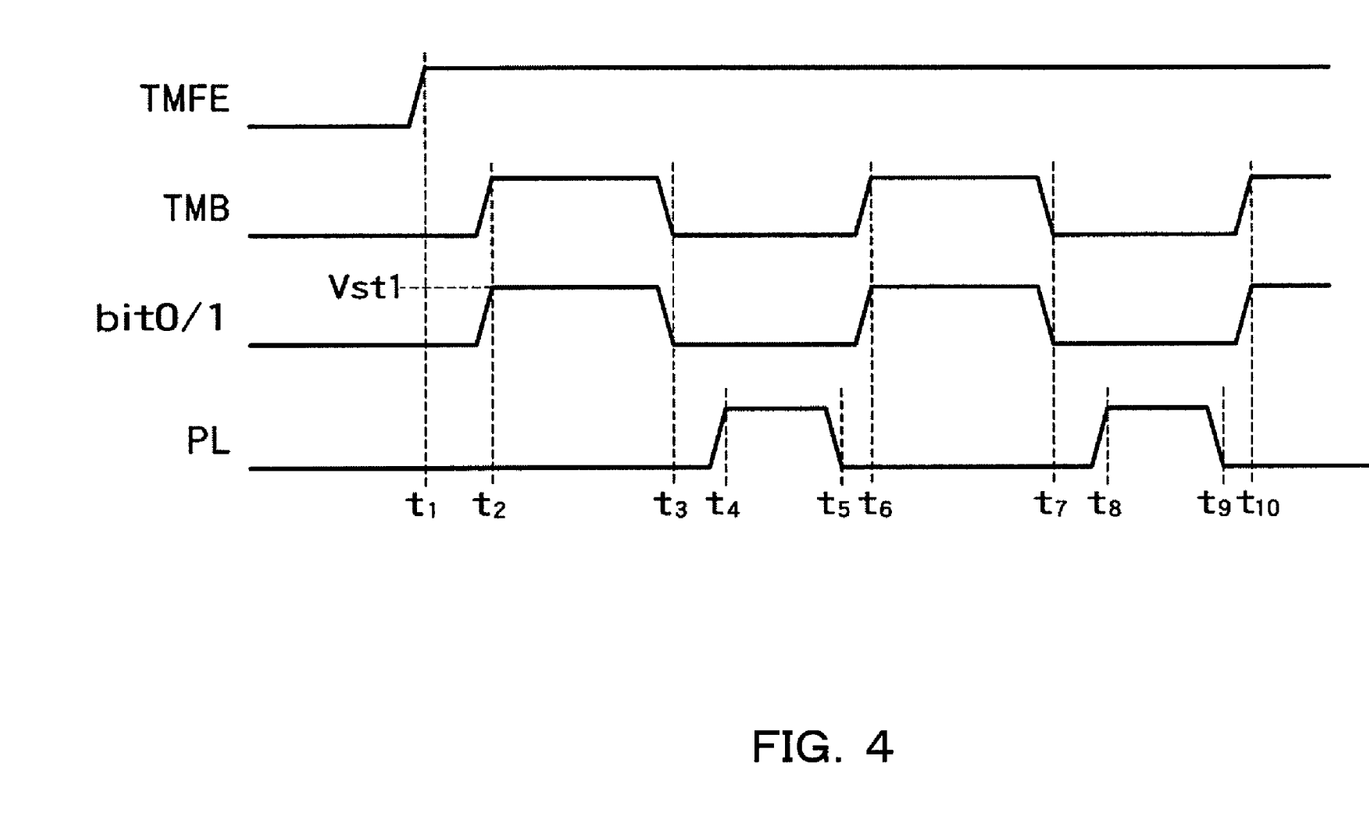
FIG. 4 is a timing chart in a fatigue test for a ferroelectric memory according to the embodiment.

FIG. 4 is a timing chart at the fatigue test for the ferroelectric memory according to the embodiment. At this time, the reset signal RST (bar) is activated to the high level. Meanwhile, a portion of or all of the word lines WL are activated to the high level. In a case where the multiple word lines WL are activated, it is possible to conduct the fatigue tests for the memory cells MC connected to the multiple word lines WL at the same time.

In the normal operation and in the evaluation test of the polarization characteristics of the ferroelectric capacitor FC (until a time point t1), the fatigue test enable signal TMFE is inactivated at the low level. At this time, the potentials of the nodes N0, N1 are in the floating state.

When the fatigue test enable signal TMFE is activated at the time point t1, the NAND gate G1 and the NOR gate G2 shown in FIG. 3 are activated. In this way, the NAND gate G1 and the NOR gate G2 can output the signals corresponding to the logic of the test bit line signal TMB.

Between time points t2, t3, the test bit line signal TMB is activated to be in the high level. Hence the transistors T200, T210 are made conductive. In this way, the electric potential of each of the node N0 and the node N1 (the electric potential on each of the bit lines BLi, bBLi) becomes the high level electric potential Vst1. Accordingly, the electric potential at one of the electrodes of the ferroelectric capacitor FC is set to the high level Vst1 via the bit line BL. At this time, the plate line driver PLD maintains the voltage on the plate line PL at the low level VSS. Accordingly, the electric potential at the other electrode of the ferroelectric capacitor FC is maintained to the low level VSS via the plate line PL. The polarization direction of the ferroelectric capacitor FC is determined and one of the binary data pieces "0" and "1" is written into the ferroelectric capacitor FC.

The signal TMB is returned to the low level VSS at a time point t3, and then the electric potential on the plate line PL is increased to the high level Vst1 between time points t4, t5. Hence the transistors T201, T211 are made conductive. In this way, the electric potential of each of the nodes N0, N1 (the electric potential on the bit lines BLi, bBLi) is set to the low level VSS. Accordingly, the electric potential at one of the electrodes of the ferroelectric capacitor FC is set to the level VSS via the bit line BL. At this time, the plate line driver PLD sets the voltage on the plate line PL to the high level Vst1. Accordingly, the electric potential at the other electrode of the ferroelectric capacitor FC is set to the high level Vst1 via the plate line PL. The polarization direction of the ferroelectric capacitor is determined and the other one of the binary data pieces "0" and "1" is written into the ferroelectric capacitor FC.

Procedures between time points t6, t7 are similar to the procedures between the time points t2, t3. Procedures between time points t8, t9 are similar to the procedures between the time points t4, t5.

As described above, the bit line BL and the plate line PL apply the alternately inverted stress voltages to the ferroelectric capacitor. As a result, it is possible to achieve the fatigue test for the memory cell. The first voltage source Vst1 is a constant internal voltage source which is also used in the normal operation. Therefore, according to the embodiment, it is possible to grasp the degree of fatigue of the ferroelectric capacitor FC in the normal operation accurately while the chip size of the memory is kept small.

According to the embodiment, the line extending from the node N0 to the bit line BL0, the line extending from the node N1 to the bit line bBL0, and the test transistors TT0 to TT2n+1 are shared in the evaluation test of the polarization characteristics and the fatigue test. This makes it possible to keep the chip size small. Moreover, by reducing the number of the elements to be connected to the sense amplifier SA, parasitic capacitance of the sense amplifier SA can be kept low. Accordingly, the sense amplifier SA can perform a sensing operation at a high speed.

Second Embodiment

Figure 5A:
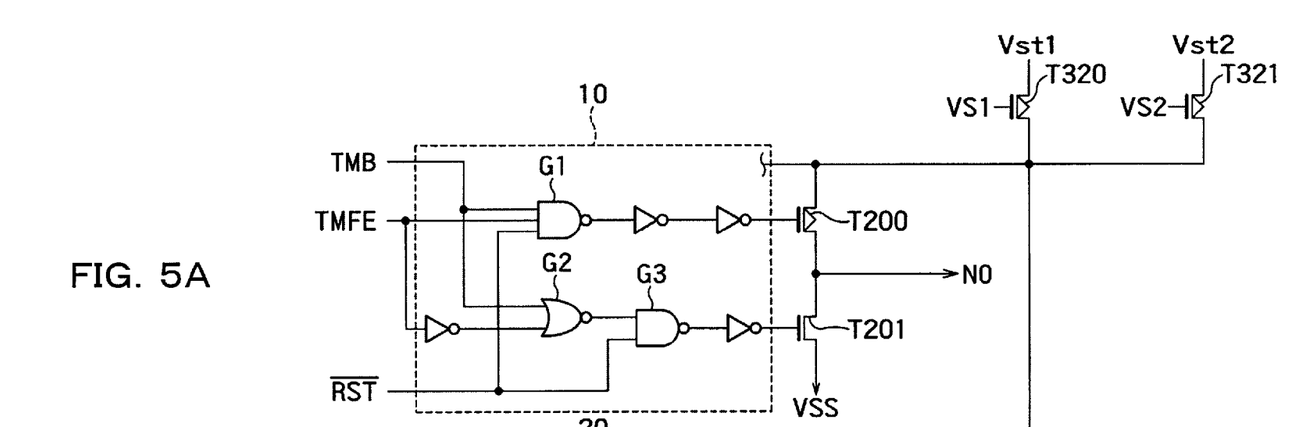
FIGS. 5A, 5B are circuit diagrams each showing internal configuration of a fatigue test bias circuit FTBC according to a second embodiment.
Figure 5B:
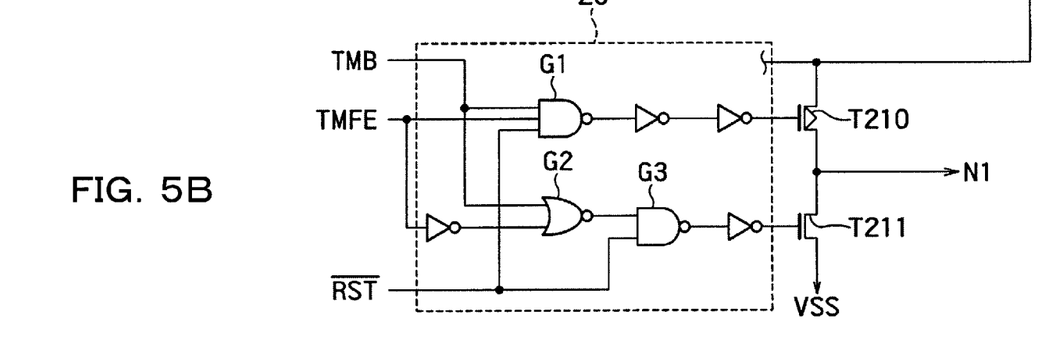

FIG. 5A and FIG. 5B are circuit diagrams each showing internal configuration of a fatigue test bias circuit FTBC according to a second embodiment. The second embodiment is different from the first embodiment in a configuration of a first voltage source of the fatigue test bias circuit FTBC. Other portions of the configuration of the second embodiment may be the same as the configuration of the first embodiment.

The first voltage source of the second embodiment is a power circuit which includes multiple stress voltage sources Vst1, Vst2. The first stress voltage source Vst1 may be similar to the voltage source Vst1 in the first embodiment. The second stress voltage source Vst2 is the voltage source having higher electric potential than the first stress voltage source Vst1 does. The first stress voltage source Vst1 is connected to one end on a high voltage supply side of each of the transistors T200, T210 via a transistor T320.

According to the second embodiment, it is possible to conduct the fatigue test by using the voltage source Vst2 which is a higher voltage than the voltage source Vst1 that is used for the normal operation. Accordingly, the fatigue test can be conducted in an accelerated manner.

Selection of which to use the voltage source Vst1 or Vst2, or selection of which of the transistor T320 or T321 is made conductive may be made depending on the test condition.

In the first and second embodiments, the fatigue test bias circuit FTBC is incorporated in the memory chip. However, it is also possible to delete the fatigue test bias circuit FTBC from the memory chip instead, by providing an external testing apparatus (not shown) with a similar function to the fatigue test bias circuit FTBC. This will make the chip size further smaller. Voltages to evaluate the polarization characteristics of the multiple ferroelectric capacitors by changing the voltages given to the multiple ferroelectric capacitors, or voltages for the fatigue test to write alternately the binary data into the multiple ferroelectric capacitors in a repeated manner are applied from the outside to the test pads P0, P1.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor memory comprising:
a plurality of memory cells aligned in a two dimensional matrix, each memory cell comprising a ferroelectric capacitor comprising a ferroelectric film between two electrodes and a cell transistor corresponding to the ferroelectric capacitor;
a plurality of bit lines connected to the plurality of memory cells;
a plurality of word lines connected to gate electrodes of the plurality of cell transistors;
a plurality of plate lines connected to a first one of two electrodes of the plurality of ferroelectric capacitors;
a plurality of sense amplifiers connected between a pair of the plurality of bit lines;
at least one test pad configured to charge an external voltage to the plurality of bit lines;
a plurality of test transistors corresponding to the plurality of bit lines, the plurality of test transistors connected between the test pad and the plurality of bit lines; and
a fatigue test bias circuit connected to a first node between the test pad and the plurality of test transistors,
wherein the plurality of test transistors are shared in a first test in which the test pad is configured to charge a first voltage to the plurality of ferroelectric capacitors and a second test in which the fatigue test bias circuit is configured to charge a second voltage to the plurality of ferroelectric capacitors.

2. The semiconductor memory of claim 1, wherein the first test is a test to evaluate polarization characteristics of the plurality of ferroelectric capacitors by varying the first voltage, and the second test is a fatigue test to alternately write binary data in the plurality of ferroelectric capacitors in a repeated manner.

3. The semiconductor memory of claim 1, wherein the fatigue test bias circuit comprises:
- a first transistor connected between the first node and a first voltage source;
- a second transistor connected between the first node and a second voltage source; and
- a logic circuit configured to switch the first and the second transistors non-conductive at the time of the first test and during a normal operation and to switch the first or the second transistors conductive at the time of the second test.

4. The semiconductor memory of claim 3, wherein the first voltage source is configured to charge any one of a plurality of stress voltages.

5. The semiconductor memory of claim 3, wherein the logic circuit is configured to turn the first and the second transistors conductive and non-conductive alternately in a repeated manner at the time of the second test.

6. The semiconductor memory of claim 3, wherein an electric potential of the first node is switched between a substantially high level electric potential when the first transistor becomes conductive and a low level electric potential when the second transistor becomes conductive.

7. The semiconductor memory of claim 1 comprising a first and a second test pads, the first test pad configured to charge the external voltage to a first bit line of the pair of the plurality of bit lines, the second test pad configured to charge the external voltage to a second bit line of the pair of the plurality of bit lines.

8. The semiconductor memory of claim 7 wherein a first test transistor of the plurality of test transistors is connected between the first test pad and the first bit line of the pair of the plurality of bit lines, a second test transistor of the plurality of test transistors is connected between the second test pad and the second bit line of the pair of the plurality of bit line.

9. The semiconductor memory of claim 1, wherein the ferroelectric capacitor and the cell transistor are connected in series in the memory cell, a first end of the cell transistor is connected to a first bit line of the plurality of bit lines.

10. The semiconductor memory of claim 1, wherein the memory cell comprises serially connected unit cells each comprising the cell transistor comprising a source terminal and a drain terminal and the ferroelectric capacitor inbetween the two terminals.

11. A test method for a semiconductor memory comprising a plurality of memory cells aligned in two dimensions in a matrix, each memory cell comprising a ferroelectric capacitor comprising a ferroelectric film between two electrodes and a cell transistor corresponding to the ferroelectric capacitor, a plurality of bit lines connected to the plurality of memory cells, a plurality of word lines connected to gate electrodes of the plurality of cell transistors, a plurality of plate lines connected to a first one of two electrodes of the plurality of ferroelectric capacitors, a plurality of sense amplifiers connected between a pair of the plurality of bit lines, at least one test pad configured to charge an external voltage to the plurality of bit lines, a plurality of test transistors corresponding to the plurality of bit lines, the plurality of test transistors connected between the test pad and the plurality of bit lines and a fatigue test bias circuit connected to a first node between the test pad and the plurality of test transistors, the test method comprising:
- selecting either a first test comprising charging a first voltage to the plurality of ferroelectric capacitors from the test pad or a second test comprising charging a second voltage to the plurality of ferroelectric capacitors from the fatigue test bias circuit, in response to an enable signal;
- charging the voltage of the selected test to the plurality of ferroelectric capacitors via the test transistor; and
- evaluating polarization characteristics of the plurality of ferroelectric capacitors after charging the voltage of the selected test.

12. The test method for the semiconductor memory of claim 11, wherein the first test is a test to evaluate polarization characteristics of the plurality of ferroelectric capacitors by varying the first voltage, and the second test is a fatigue test to alternately write binary data in the plurality of ferroelectric capacitors in a repeated manner.

13. The test method for the semiconductor memory of claim 12, further comprising gradually increasing or decreasing the first voltage.

14. The test method for the semiconductor memory of claim 12, further comprising alternately varying the second voltage between a substantially high level electric potential and substantially low level electric potential in a repeated manner.

15. The test method for the semiconductor memory of claim 11, wherein the fatigue test bias circuit comprises:
- a first transistor connected between the first node and a first voltage source;
- a second transistor connected between the first node and a second voltage source; and
- a logic circuit configured to switch the first and the second transistors non-conductive at the time of the first test and during a normal operation and to switch the first or the second transistors conductive at the time of the second test.

16. The test method for the semiconductor memory of claim 15, wherein the logic circuit is configured to switch the first and the second transistors conductive and non-conductive alternately.

17. The test method for the semiconductor memory of claim 15, wherein the first voltage source is configured to charge any one of a plurality of stress voltages.

18. The test method for the semiconductor memory of claim 11, wherein the test pad is electrically disconnected from the outside during the second test.

19. The test method for the semiconductor memory of claim 11, wherein the first test is conducted at a wafer stage before dicing.

20. The test method for the semiconductor memory of claim 11, wherein the second test is conducted by sampling several chips after the chips are assembled.

* * * * *